United States Patent
Yu et al.

(10) Patent No.: US 9,711,458 B2
(45) Date of Patent: Jul. 18, 2017

(54) STRUCTURE AND FORMATION METHOD FOR CHIP PACKAGE

(71) Applicant: Taiwan Semiconductor Manufacturing Co., Ltd., Hsinchu (TW)

(72) Inventors: Chen-Hua Yu, Hsinchu (TW); Wen-Chih Chiou, Miaoli County (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 14/941,215

(22) Filed: Nov. 13, 2015

(65) Prior Publication Data
US 2017/0141040 A1    May 18, 2017

(51) Int. Cl.
| | |
|---|---|
| H01L 23/00 | (2006.01) |
| H01L 23/538 | (2006.01) |
| H01L 23/31 | (2006.01) |
| H01L 23/29 | (2006.01) |
| H01L 25/065 | (2006.01) |
| H01L 21/56 | (2006.01) |
| H01L 21/768 | (2006.01) |
| H01L 21/3105 | (2006.01) |
| H01L 21/02 | (2006.01) |

(52) U.S. Cl.
CPC .... *H01L 23/5386* (2013.01); *H01L 21/02263* (2013.01); *H01L 21/31051* (2013.01); *H01L 21/565* (2013.01); *H01L 21/7684* (2013.01); *H01L 21/76802* (2013.01); *H01L 21/76877* (2013.01); *H01L 23/291* (2013.01); *H01L 23/293* (2013.01); *H01L 23/3135* (2013.01); *H01L 24/05* (2013.01); *H01L 24/13* (2013.01); *H01L 25/0655* (2013.01); *H01L 2224/12105* (2013.01); *H01L 2224/13025* (2013.01)

(58) Field of Classification Search
CPC ...................................... H01L 23/485
See application file for complete search history.

(56) References Cited

U.S. PATENT DOCUMENTS

| | | | |
|---|---|---|---|
| 6,423,570 B1 * | 7/2002 | Ma ......... | H01L 21/561 257/612 |
| 6,746,898 B2 * | 6/2004 | Lin .......... | H01L 23/36 257/E23.062 |
| 6,890,829 B2 * | 5/2005 | Cheng ....... | H01L 23/5227 257/531 |

(Continued)

FOREIGN PATENT DOCUMENTS

| | | |
|---|---|---|
| KR | 20090056835 A | 6/2009 |
| KR | 20150016866 A | 2/2015 |

*Primary Examiner* — William Harriston
(74) *Attorney, Agent, or Firm* — Slater Matsil, LLP (57) ABSTRACT

Structures and formation methods of a chip package are provided. The chip package includes a semiconductor die and a package layer partially or completely encapsulating the semiconductor die. The chip package also includes a polymer layer over the semiconductor die and the package layer. The chip package further includes a dielectric layer over the polymer layer. The dielectric layer is substantially made of a semiconductor oxide material. In addition, the chip package includes a conductive feature in the dielectric layer electrically connected to a conductive pad of the semiconductor die.

20 Claims, 11 Drawing Sheets

(56) References Cited

U.S. PATENT DOCUMENTS

| | | |
|---|---|---|
| 7,064,439 B1 * | 6/2006 | Berthold ........... H01L 21/76829 |
| | | 257/750 |
| 7,790,576 B2 | 9/2010 | Bathan et al. |
| 9,478,498 B2 | 10/2016 | Lin et al. |
| 2002/0064965 A1 | 5/2002 | Wu |
| 2003/0122246 A1 | 7/2003 | Lin et al. |
| 2011/0006429 A1 | 1/2011 | Liu et al. |
| 2011/0210441 A1 | 9/2011 | Lee et al. |
| 2012/0298410 A1 | 11/2012 | Lu et al. |
| 2013/0001776 A1 | 1/2013 | Yu et al. |
| 2014/0183693 A1 | 7/2014 | Tsai et al. |
| 2014/0252558 A1 | 9/2014 | Yu et al. |
| 2015/0155248 A1 * | 6/2015 | Lin ................... H01L 23/49822 |
| | | 257/737 |
| 2015/0243636 A1 | 8/2015 | Hu et al. |

* cited by examiner

STRUCTURE AND FORMATION METHOD FOR CHIP PACKAGE

BACKGROUND

With the constant evolution of semiconductor technology, semiconductor dies are increasingly becoming smaller. More functions, however, need to be integrated into these semiconductor dies. Accordingly, these semiconductor dies have increasingly greater numbers of I/O pads packaged into smaller areas, and the density of the I/O pads is quickly rising. As a result, the packaging of semiconductor dies is becoming more difficult.

Package technologies can be divided into multiple categories. In one of the categories of packaging, dies are sawed from wafers before they are packaged onto other wafers, and only "known-good-dies" are packaged. An advantage of this packaging technology is the possibility of forming fan-out chip packages, which means that the I/O pads on a die can be redistributed to a greater area than the die itself. Therefore, the number of I/O pads packed on the surfaces of the dies can be increased.

New packaging technologies have been developed to further improve the density and functions of semiconductor dies. These relatively new types of packaging technologies for semiconductor dies face manufacturing challenges.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Some embodiments of the disclosure are described. FIGS. 1A-1J are cross-sectional views of various stages of a process for forming a chip package, in accordance with some embodiments. Additional operations can be provided before, during, and/or after the stages described in FIGS. 1A-1J. Some of the stages that are described can be replaced or eliminated for different embodiments. Additional features can be added to the semiconductor device structure. Some of the features described below can be replaced or eliminated for different embodiments. Although some embodiments are discussed with operations performed in a particular order, these operations may be performed in another logical order.

Figure 1A:
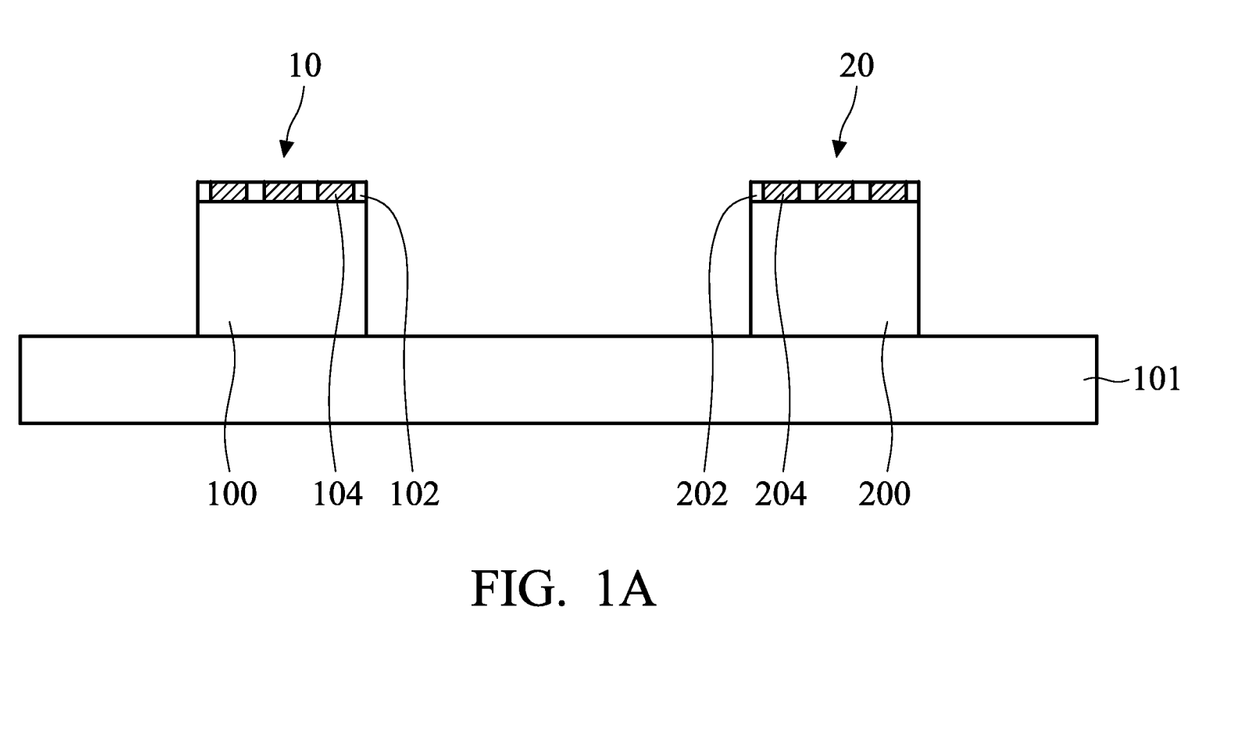
FIGS. 1A-1J are cross-sectional views of various stages of a process for forming a chip package, in accordance with some embodiments.

As shown in FIG. 1A, multiple semiconductor dies, including semiconductor dies 10 and 20, are attached on a carrier substrate 101, in accordance with some embodiments. In some embodiments, an adhesion layer (not shown) is used to fix the semiconductor dies 10 and 20 on the carrier substrate 101. In some embodiments, the semiconductor dies 10 and 20 have the same functions. In some other embodiments, the semiconductor dies 10 and 20 have different functions. In some embodiments, both of the semiconductor dies 10 and 20 are "known-good-dies". The semiconductor dies 10 and 20 may be obtained from sawing the same semiconductor wafer. Alternatively, the semiconductor dies 10 and 20 may be obtained from sawing different semiconductor wafers.

In some embodiments, the semiconductor die 10 includes a semiconductor substrate 100 and an interconnection structure formed on the semiconductor substrate 100. The interconnection structure includes multiple interlayer dielectric layers and multiple conductive features formed in the interlayer dielectric layers. These conductive features include conductive lines, conductive vias, and conductive contacts. For the purpose of simplification, FIG. 1A merely shows one of the interlayer dielectric layers (the dielectric layer 102) and conductive pads 104 formed in and/or on the dielectric layer 102. The conductive pads 104 may be portions of conductive lines formed in the dielectric layer 102. The conductive pads 104 may be wider portions of the conductive lines. In some embodiments, the conductive pads 104 are metal pillars formed on other conductive pads. Similarly, the semiconductor die 20 also includes a semiconductor substrate 200 and an interconnection structure including a dielectric layer 202 and conductive pads 204.

In some embodiments, various device elements are formed in the semiconductor substrates 100 and 200. Examples of the various device elements include transistors (e.g., metal oxide semiconductor field effect transistors (MOSFET), complementary metal oxide semiconductor (CMOS) transistors, bipolar junction transistors (BJT), high voltage transistors, high frequency transistors, p-channel and/or n-channel field effect transistors (PFETs/NFETs), etc.), diodes, or other suitable elements.

The device elements are interconnected through the interconnection structure over the semiconductor substrate 100 to form integrated circuit devices. The integrated circuit devices include logic devices, memory devices (e.g., static random access memories, SRAMs), radio frequency (RF) devices, input/output (I/O) devices, system-on-chip (SoC) devices, other applicable types of devices, or a combination thereof.

In some embodiments, the carrier substrate 101 is used as a temporary support substrate. The carrier substrate 101 may be made of a semiconductor material, ceramic material, polymer material, metal material, another suitable material, or a combination thereof. In some embodiments, the carrier substrate 101 is a glass substrate. In some other embodiments, the carrier substrate 101 is a semiconductor substrate, such as a silicon wafer.

Figure 1B:
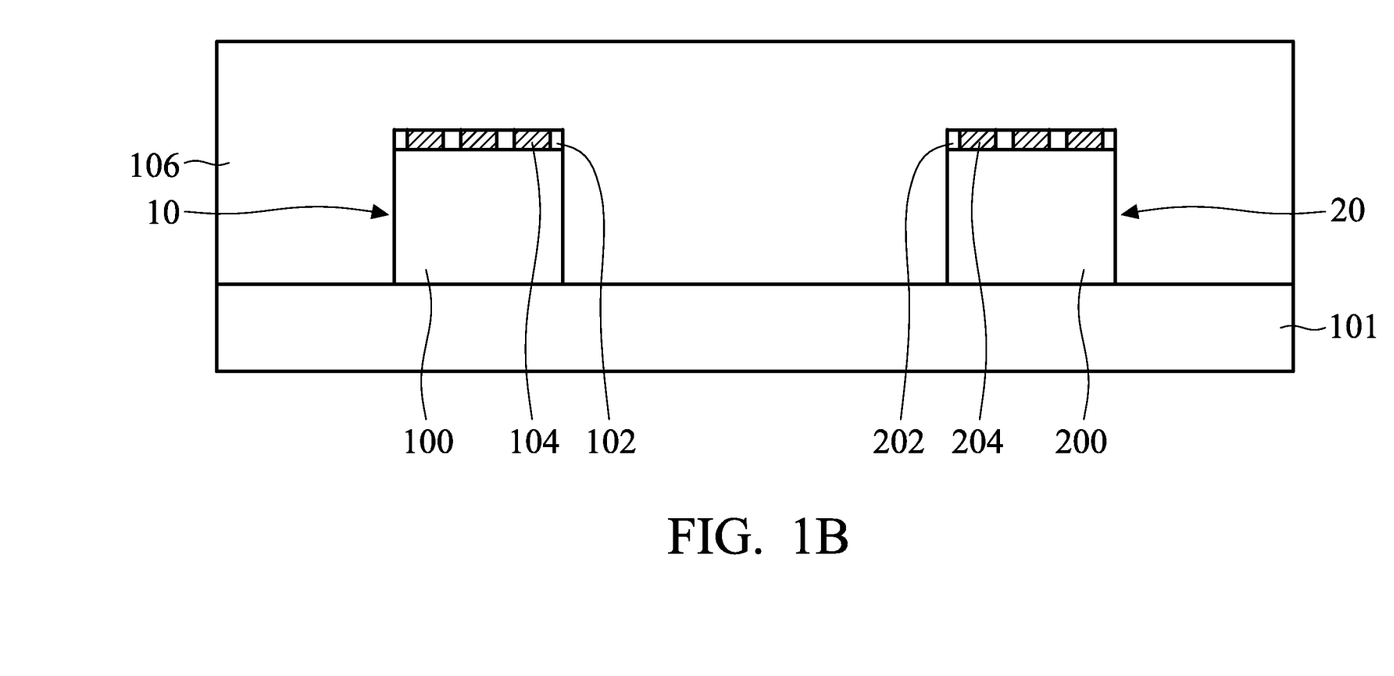

As shown in FIG. 1B, a package layer 106 is formed over the carrier substrate 101 and the semiconductor dies 10 and 20, in accordance with some embodiments. In some embodiments, the package layer 106 includes a polymer material. In some embodiments, the package layer 106 is a molding compound layer. The molding compound layer may include an epoxy-based resin. The molding compound layer may contain fillers, such as oxide fibers. In some embodiments, the package layer 106 encapsulates the semiconductor dies 10 and 20, including covering their top surfaces and sidewalls. In some other embodiments, the package layer 106 partially encapsulates the semiconductor dies 10 and 20. For example, upper portions of the semiconductor dies 10 and 20 protrude from the top surface of the package layer 106.

In some embodiments, a liquid molding compound material is applied over the carrier substrate 101 and the semiconductor dies 10 and 20. In some embodiments, a thermal process is then applied to cure the liquid molding compound material. As a result, the liquid molding compound material is hardened and transformed into the package layer 106. In some embodiments, the thermal process is performed at a temperature in a range from about 200 degrees C. to about 230 degrees C. The operation time of the thermal process may be in a range from about 1 hour to about 3 hours.

Figure 1C:
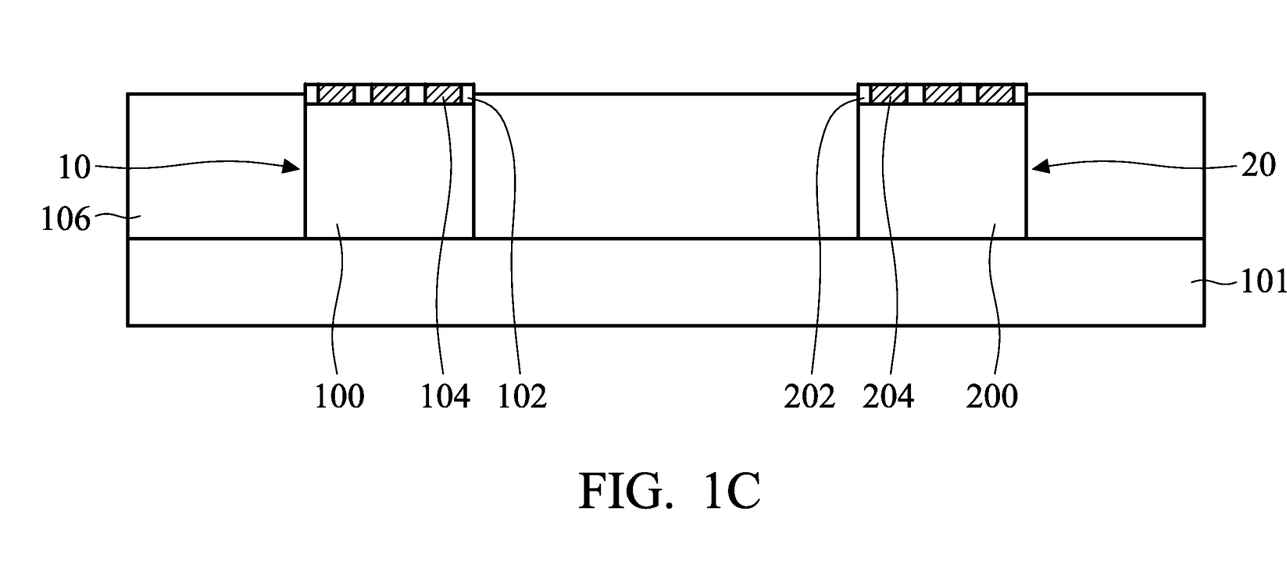

As shown in FIG. 1C, the package layer 106 is thinned to expose the conductive pads 104 and 204 of the semiconductor dies 10 and 20, in accordance with some embodiments. A planarization process may be used to thin the package layer 106. The planarization process may include a chemical mechanical polishing (CMP) process, a dry polishing process, a grinding process, an etching process, another applicable process, or a combination thereof.

In some embodiments, top surfaces of the package layer 106 and the semiconductor dies 10 and 20 are coplanar after the planarization process. However, embodiments of the disclosure are not limited thereto. In some embodiments, the top surface of the package layer 106 is lower than the top surfaces of the semiconductor dies 10 and 20, as shown in FIG. 1C.

Figure 1D:
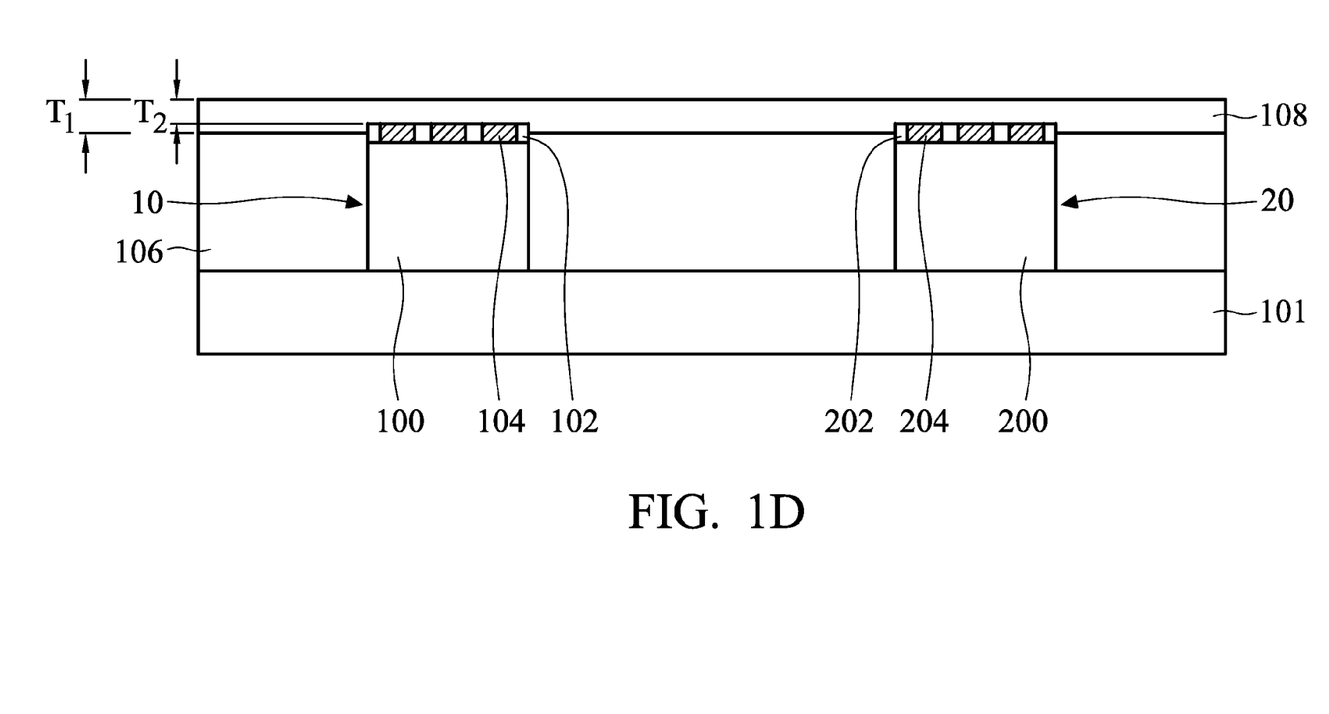

As shown in FIG. 1D, a protection layer 108 is formed over the semiconductor dies 10 and 20 and the package layer 106, in accordance with some embodiments. The protection layer 108 may be used to buffer the stress generated from a subsequently formed interconnection structure. The protection layer 108 may also be used to cover defects formed on the package layer 106 after the planarization process. The protection layer 108 may provide a planar surface to facilitate subsequent processes.

In some embodiments, the protection layer 108 is a polymer layer. In some embodiments, the polymer layer may be formed of a photo-sensitive material which can be patterned easily to form feature openings. The polymer layer may include polyimide (PI), polybenzoxazole (PBO), epoxy resin, another suitable material, or a combination thereof. In some embodiments, the protection layer 108 is formed using a spin-on process, a spray coating process, a chemical vapor deposition (CVD) process, another applicable process, or a combination thereof.

As shown in FIG. 1D, the protection layer 108 covers the entire top surface of the package layer 106, in accordance with some embodiments. In some embodiments, the protection layer 108 is in direct contact with the package layer. In some embodiments, an interface between the protection layer 108 and the package layer 106 is between an interface between the protection layer 108 and the top of the semiconductor die 10 and the bottom of the semiconductor die 10. The protection layer 108 may cover defects and/or particles on the package layer 106. Therefore, these defects and/or particle are prevented from negatively affecting the other elements.

In some embodiments, the protection layer 108 has a substantially planar top surface. In some embodiments, a planarization process is used to provide the protection layer 108 with the substantially planar top surface. The planarization process may include a CMP process, a dry polishing process, a grinding process, an etching process, another applicable process, or a combination thereof.

In some embodiments, the protection layer 108 has a uniform thickness. In some embodiments, the thickness of the protection layer 108 is in a range from about 3 μm to about 20 μm. In some other embodiments, the thickness of the protection layer 108 is in a range from about 5 μm to about 10 μm. However, embodiments of the disclosure are not limited thereto. In some embodiments, the thickness of the protection layer 108 is not uniform, and the top surface of the protection layer 108 is still planar. As shown in FIG. 1D, a portion of the protection layer 108 on the package layer 106 has a first thickness $T_1$. A portion of the protection layer 108 on the semiconductor die 10 or 20 has a second thickness $T_2$. In some embodiments, the thickness $T_1$ is greater than the thickness $T_2$.

Figure 1E:
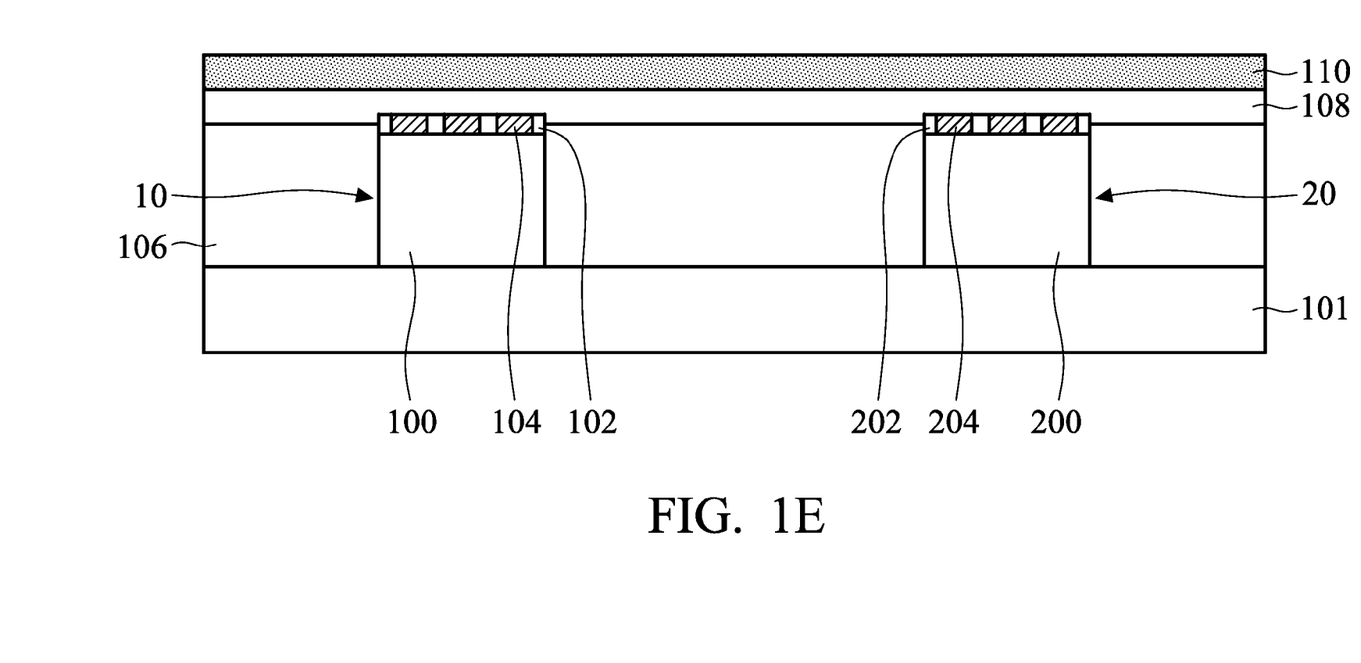

Afterwards, a dielectric layer 110 is deposited over the protection layer 108, as shown in FIG. 1E in accordance with some embodiments. In some embodiments, the dielectric layer 110 is in direct contact with the protection layer 108. In some embodiments, the dielectric layer 110 is substantially made of a semiconductor oxide material. The dielectric layer 110 is not made of a polymer material. In some embodiments, the dielectric layer 110 is harder than the protection layer 108. The protection layer 108 may be used as a stress buffering under the dielectric layer 110.

In some embodiments, the dielectric layer 110 includes silicon oxide, borosilicate glass (BSG), phosphoric silicate glass (PSG), borophosphosilicate glass (BPSG), fluorinated silicate glass (FSG), silicon oxynitride, low-k material, tetra-ethyl-ortho-silicate (TEOS) oxide, another suitable material, or a combination thereof. In some embodiments, the dielectric layer 110 is deposited using vapor deposition process such as a CVD process, an atomic layer deposition (ALD) process, a PVD process, another applicable process, or a combination thereof. In some other embodiments, the dielectric layer 110 is deposited using a spin-on process, a spray coating process, another applicable process, or a combination thereof.

Figure 1F:
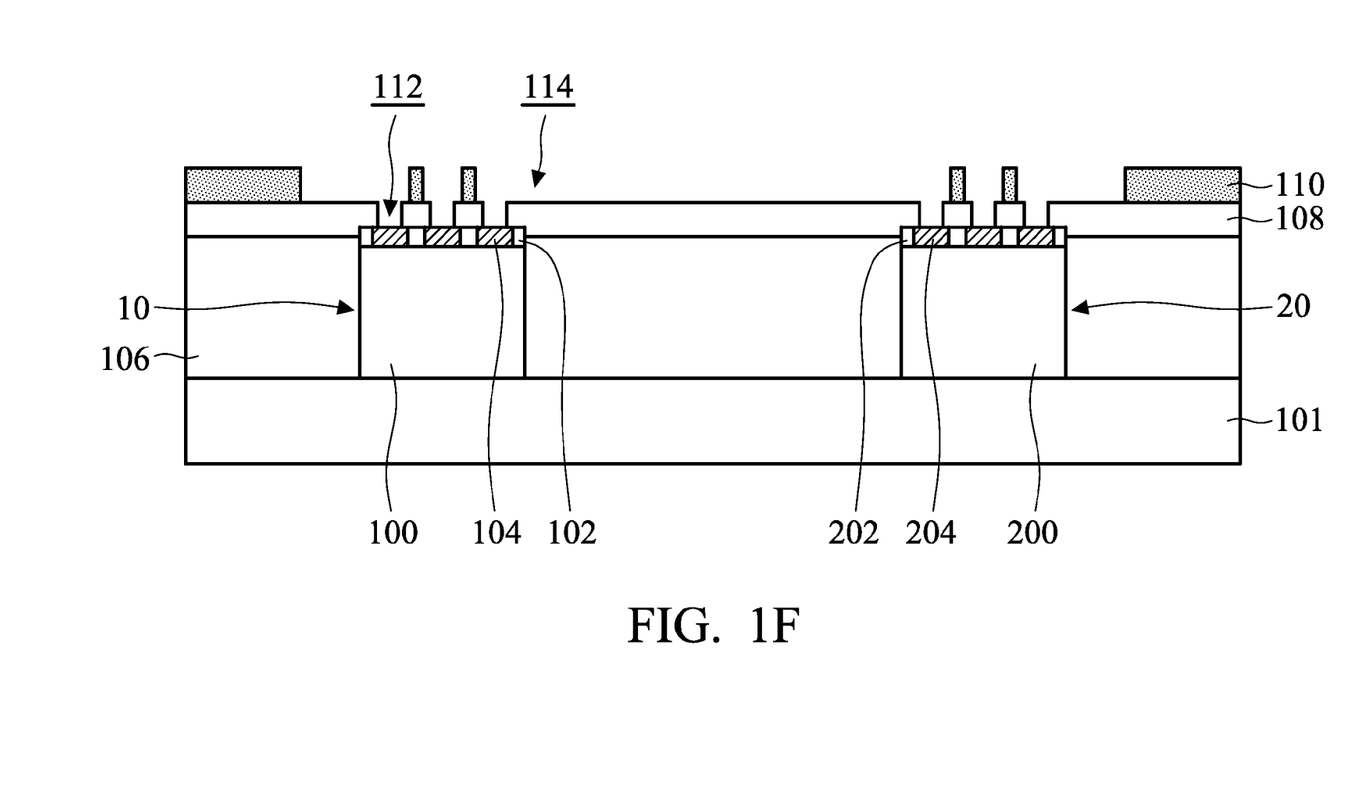

As shown in FIG. 1F, feature openings 114 are formed in the dielectric layer 110, in accordance with some embodiments. In some embodiments, the feature openings 114 are trenches used to contain conductive lines. In some embodiments, a photolithography process and an etching process are used to pattern the dielectric layer 110. As a result, the feature openings 114 are formed.

Afterwards, feature openings 112 are formed in the protection layer 108, as shown in FIG. 1F in accordance with some embodiments. In some embodiments, the feature openings 112 are via holes used to contain conductive vias. In some embodiments, the protection layer 108 is patterned using a photolithography process, a laser drilling process, another applicable process, or a combination thereof. As a result, the feature openings 112 are formed.

Figure 1G:
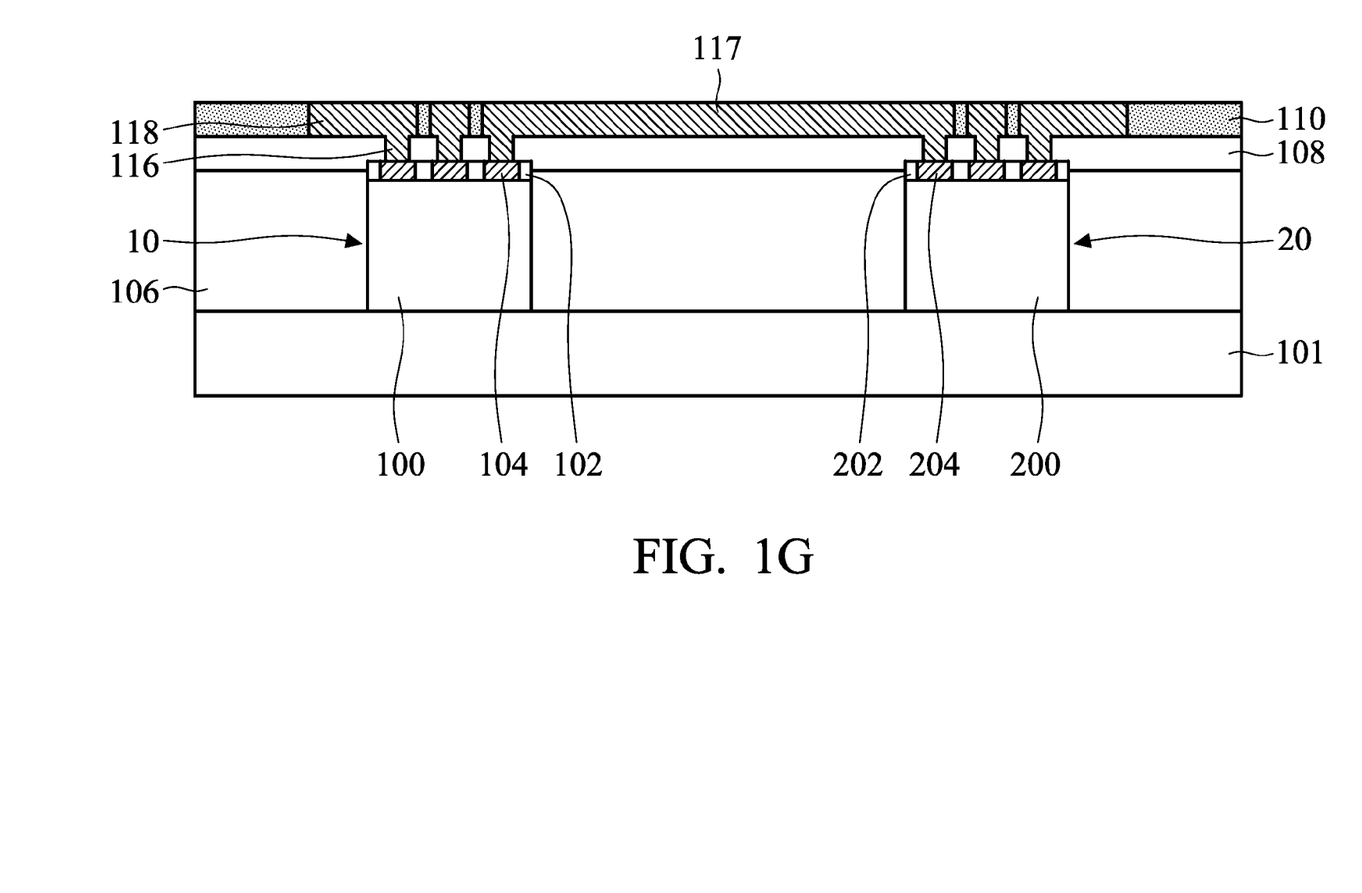

As shown in FIG. 1G, conductive features 116 and 118 are respectively formed in the feature openings 112 and 114, in accordance with some embodiments. In some embodiments, one or more conductive materials are deposited over the dielectric layer 110 to fill the feature openings 116 and 118. The conductive materials may include metal materials including copper, aluminum, tungsten, titanium, nickel, gold, platinum, silver, another suitable material, or a combination thereof. In some embodiments, the one or more conductive materials are deposited using an electroplating process, a PVD process, a CVD process, an electroless plating process, another applicable process, or a combination thereof.

Afterwards, a planarization process is used to remove the conductive materials outside of the feature openings 114. The planarization process may include a CMP process, a dry polishing process, a grinding process, an etching process, another applicable process, or a combination thereof. As a result, the remaining portions of the conductive materials in the feature openings 114 form the conductive features 118. The remaining portions of the conductive materials in the feature openings 112 form the conductive features 116. In some embodiments, the top surfaces of the conductive features 118 and the dielectric layer 110 are coplanar with each other.

The conductive features 118 may be used as conductive lines, and the conductive features 116 may be used as conductive vias. In some embodiments, each of the conductive features 116 is electrically connected to one of the conductive pads 104 or 204. In some embodiments, each of the conductive features 116 is in direct contact with one of the conductive pads 104 or 204.

In some embodiments, one of the conductive features 118 and some of the conductive features 116 together form a conductive feature 117, as shown in FIG. 1G. The conductive feature 117 electrically connects one of the conductive pads 104 of the semiconductor die 10 and one of the conductive pads 204 of the semiconductor die 20, as shown in FIG. 1G. Therefore, electrical signals may be sent or received between the semiconductor dies 10 and 20. The semiconductor die 10 is electrically coupled to the semiconductor die 20 through the conductive feature 117.

In some embodiments, barrier elements (not shown) are formed between the conductive features 118 or 117 and the dielectric layer 110. Similarly, the barrier elements may also be formed between the conductive features 116 and the protection layer 108. In some embodiments, the barrier elements are made of titanium nitride, tantalum nitride, titanium, tantalum, another suitable material, or a combination thereof. In some embodiments, a barrier material layer is deposited over the dielectric layer 110 and the sidewalls and bottoms of the feature openings 114 and 112 before the formation of the one or more conductive materials. After the planarization process for forming the conductive features 118 and 117, the barrier material layer on the top surface of the dielectric layer 110 is also removed. As a result, the remaining portions of the barrier material layer in the feature openings 114 and 112 form the barrier elements.

Figure 1H:
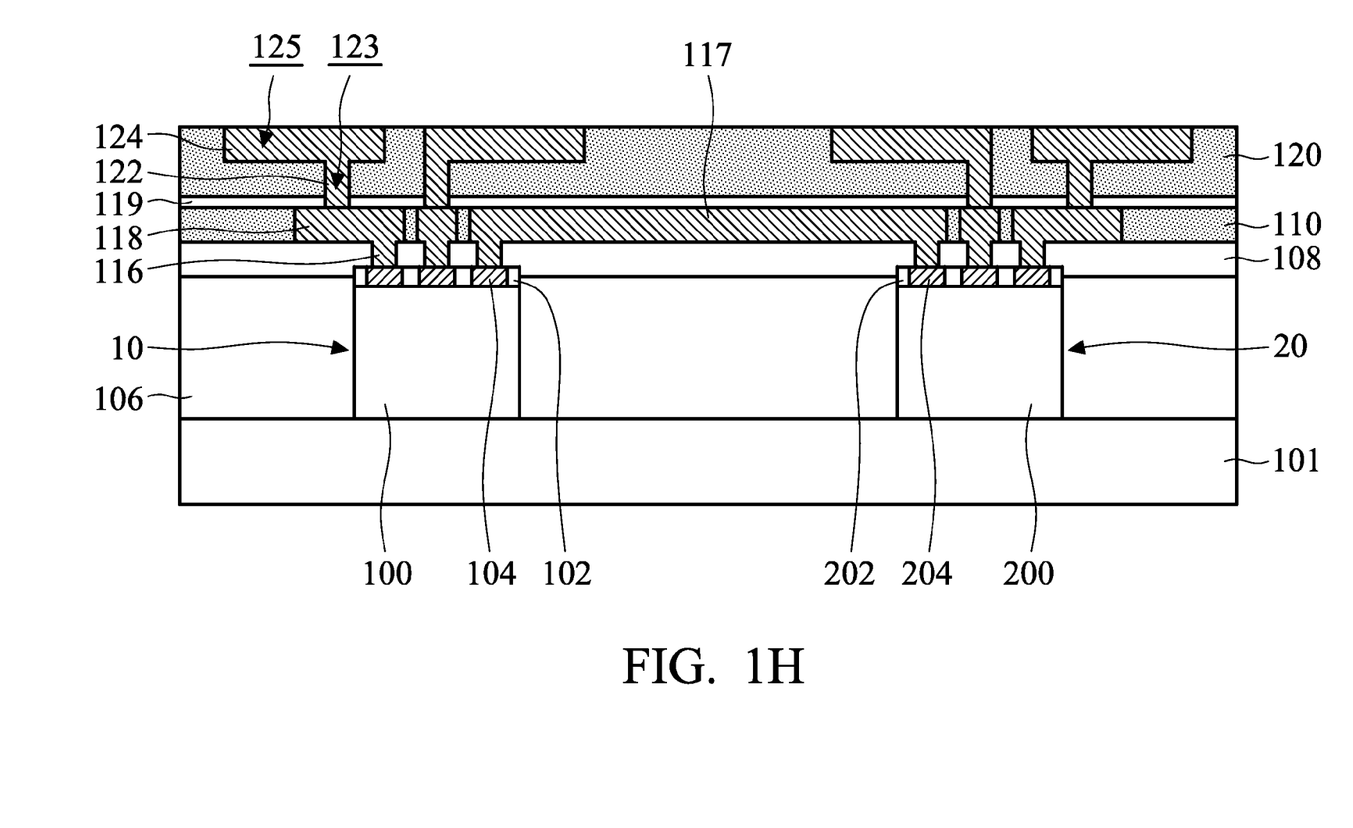

As shown in FIG. 1H, an etch stop layer 119 is deposited over the dielectric layer 110 and the conductive features 118 and 117, in accordance with some embodiments. The etch stop layer is used to assist in the subsequent formation of feature openings that expose the conductive features 118 and/or 117. The etch stop layer 119 may be made of silicon nitride, silicon oxynitride, silicon carbide, silicon carbon nitride, another suitable material, or a combination thereof. The etch stop layer 119 may be deposited using a CVD process or another applicable process.

Many variations and/or modifications can be made to embodiments of the disclosure. In some other embodiments, the etch stop layer 119 is not formed.

Afterwards, a dielectric layer 120 is deposited over the etch stop layer 119, as shown in FIG. 1H in accordance with some embodiments. In some embodiments, the material and formation method of the dielectric layer 120 is similar to or the same as those of the dielectric layer 110. In some embodiments, the dielectric layer 120 is thicker than the dielectric layer 110.

As shown in FIG. 1H, feature openings 125 and 123 are formed in the dielectric layer 120, in accordance with some embodiments. In some embodiments, the feature openings 125 are trenches, and the feature openings 123 are via holes. The feature openings 125 and 123 are connected with each other. In some embodiments, the feature openings 125 and 123 are formed using multiple photolithography processes and etching processes. In some embodiments, the feature openings 125 and 123 are formed using a "via first" process. In some other embodiments, the feature openings 125 and 123 are formed using a "trench first" process. In some embodiments, the feature openings 123 expose the etch stop layer 119. Afterwards, the exposed portions of the etch stop layer 119 are removed to expose the conductive features 118.

Afterwards, conductive features 124 and 122 are respectively formed in the feature openings 125 and 123, as shown in FIG. 1H in accordance with some embodiments. In some embodiments, the conductive features 124 and 122 are made of copper, aluminum, tungsten, titanium, nickel, gold, platinum, silver, another suitable material, or a combination thereof. In some embodiments, one or more conductive materials are deposited over the dielectric layer 120 to fill the feature openings 125 and 123. In some embodiments, the one or more conductive materials are deposited using an electroplating process, a PVD process, a CVD process, an electroless plating process, another applicable process, or a combination thereof.

Afterwards, a planarization process is used to remove the conductive materials outside of the feature openings 114. The planarization process may include a CMP process, a dry polishing process, a grinding process, an etching process, another applicable process, or a combination thereof. As a result, the remaining portions of the conductive materials in the feature openings 125 form the conductive features 124. The remaining portions of the conductive materials in the feature openings 123 form the conductive features 122. In some embodiments, the top surfaces of the conductive features 125 and the dielectric layer 120 are coplanar with each other.

The conductive features 124 may be used as conductive lines, and the conductive features 122 may be used as conductive vias. In some embodiments, each of the conductive features 122 is electrically connected to one of the conductive features 118 or 117. In some embodiments, each of the conductive features 122 is in direct contact with one of the conductive features 118 or 117.

In some embodiments, barrier elements (not shown) are formed between the conductive features 124 and the dielectric layer 120. Similarly, the barrier elements may also be formed between the conductive features 122 and the dielectric layer 120. In some embodiments, the barrier elements are made of titanium nitride, tantalum nitride, titanium, tantalum, another suitable material, or a combination thereof. In some embodiments, a barrier material layer is deposited over the dielectric layer 120 and the sidewalls and bottoms of the feature openings 125 and 123 before the formation of the one or more conductive materials. After the planarization process for forming the conductive features 124 and 122, the barrier material layer on the top surface of the dielectric layer 120 is also removed. As a result, the remaining portions of the barrier material layer in the feature openings 125 and 123 form the barrier elements.

In some embodiments, the processes illustrated in FIG. 1H are repeated one or more times to form one or more dielectric layers and conductive features on the structure shown in FIG. 1H. In accordance with some embodiments, the interconnection structure formed on the protection layer 108 includes multiple dielectric layers that are not made of a polymer material. For example, the dielectric layers are made of a semiconductor oxide material such as silicon oxide. Since these dielectric layers are made of the semiconductor oxide material, they may be patterned using photolithography and etching processes which enable the formation of sub-micron interconnect.

Many variations and/or modifications can be made to embodiments of the disclosure. In some embodiments, the interconnection structure on the protection layer 108 is formed using dual damascene processes. However, embodiments of the disclosure are not limited thereto. In some other embodiments, the interconnection structure is formed using single damascene processes. In some other embodiments, the interconnection structure is formed using a combination of single damascene processes and dual damascene processes.

Figure 1I:
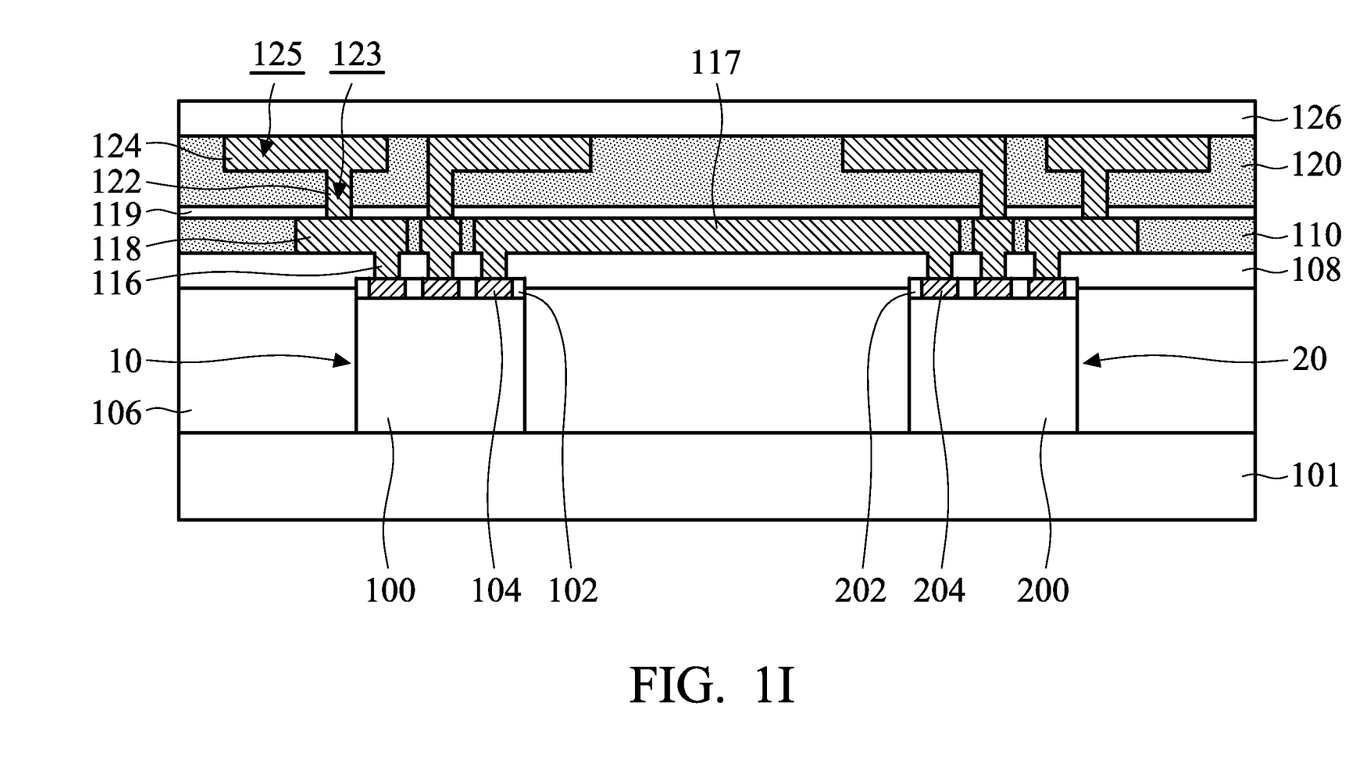

As shown in FIG. 1I, a protection layer 126 is deposited over the interconnection structure including the dielectric layers 120 and 110 and the conductive features 124, 122, 118, and 116, in accordance with some embodiments. The protection layers 126 and 108 together sandwich the interconnect structure for stress buffering. Therefore, the reliability and quality of the chip package are improved.

In some embodiments, the protection layer 126 is a polymer layer. In some embodiments, the polymer layer may be formed of a photo-sensitive material which can be patterned easily to form feature openings. The polymer layer may include polyimide (PI), polybenzoxazole (PBO), epoxy resin, another suitable material, or a combination thereof. In some embodiments, the protection layers 126 and 108 are made of the same material. In some other embodiments, the protection layers 126 and 108 are made of different materials. In some embodiments, the protection layer 126 is formed using a spin-on process, a spray coating process, a chemical vapor deposition (CVD) process, another applicable process, or a combination thereof.

Figure 1J:
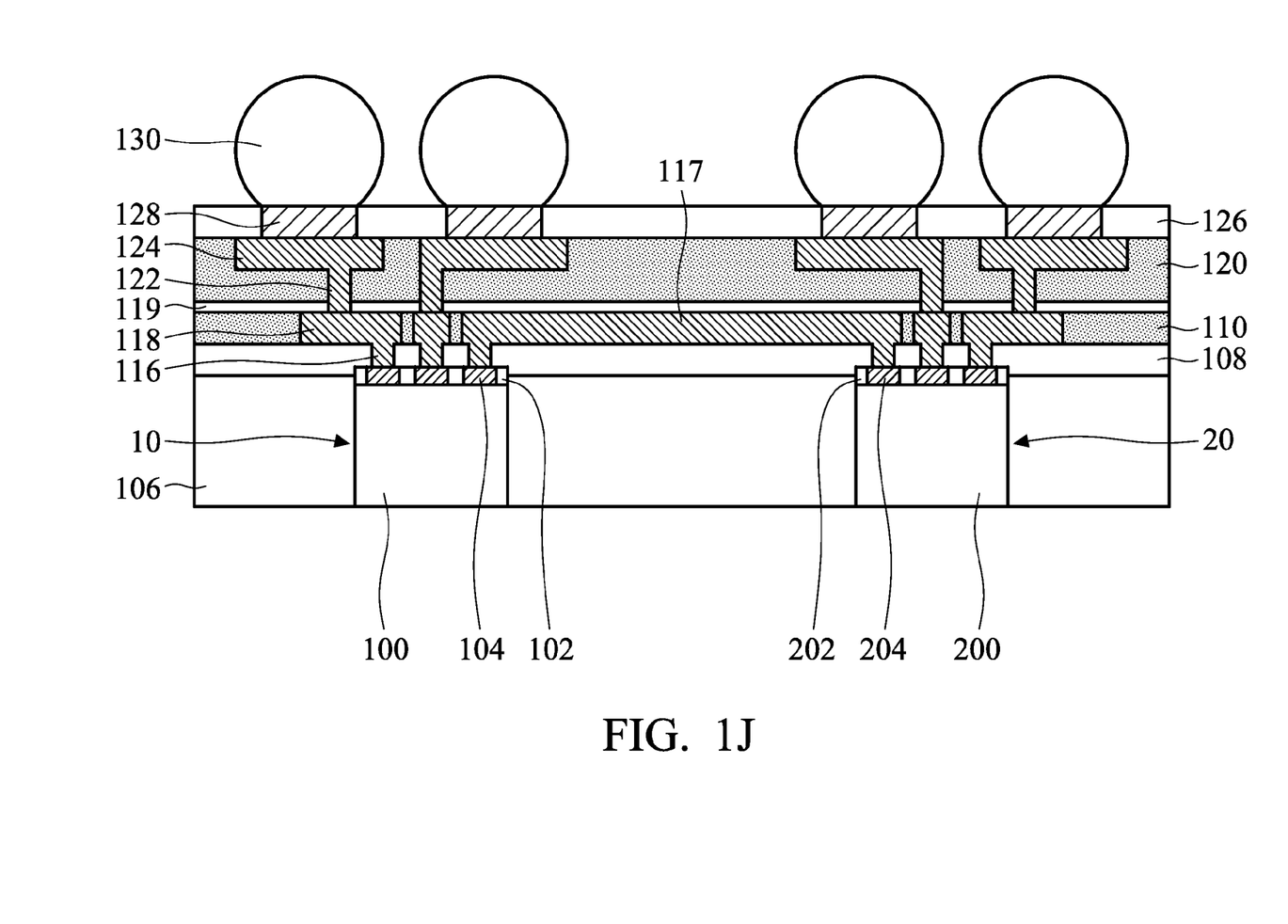

As shown in FIG. 1J, under-bump metallurgy (UBM) elements 128 are formed in the protection layer 126, in accordance with some embodiments. In some embodiments, the protection layer 126 is patterned to form openings that expose the conductive features 124. Afterwards, one or more layers are deposited and patterned to form the UBM elements 128. In some embodiments, the UBM elements 128 include a diffusion barrier layer and a seed layer. The diffusion barrier layer may be formed of tantalum nitride, although it may also be formed of other materials such as titanium nitride, tantalum, titanium, or the like. The seed layer may be a copper seed layer formed on the diffusion barrier layer. The copper seed layer may be formed of copper or one of the copper alloys that include silver, chromium, nickel, tin, gold, or a combination thereof. In some embodiments, each of the UBM elements 128 includes a diffusion barrier layer formed of Ti and a seed layer formed of Cu.

Afterwards, conductive connectors 130 are correspondingly formed on the UBM elements 128, as shown in FIG. 1J in accordance with some embodiments. Each of the conductive connectors 130 is electrically connected to a corresponding one of the conductive features 124 through a corresponding UBM element 128. In some embodiments, the conductive connectors 130 include solder bumps or solder balls. In some embodiments, solder balls are placed on the UBM elements 128 and reflowed to form the conductive connectors 130. In some other embodiments, solder material is electroplated on the UBM elements 128 to form the conductive connectors 130. In some other embodiments, the conductive connectors 130 are made of a metal material other than solder material. The conductive connectors 130 may be made of copper, aluminum, gold, another suitable material, or a combination thereof.

After the formation of the conductive connectors 130, a fan-out wafer is formed, in accordance with some embodiments. Afterwards, the fan-out wafer is detached from the carrier substrate 101 and sawed into multiple chip packages. FIG. 1J shows one of the chip packages, in accordance with some embodiments. The chip package includes two semiconductor dies including the semiconductor dies 10 and 20. In some embodiments, the semiconductor dies 10 and 20 have different functions from each other. In some embodiments, the semiconductor dies 10 and 20 are electrically communicated with each other through the interconnection structure formed between the protection layers 108 and 126.

Figure 2:
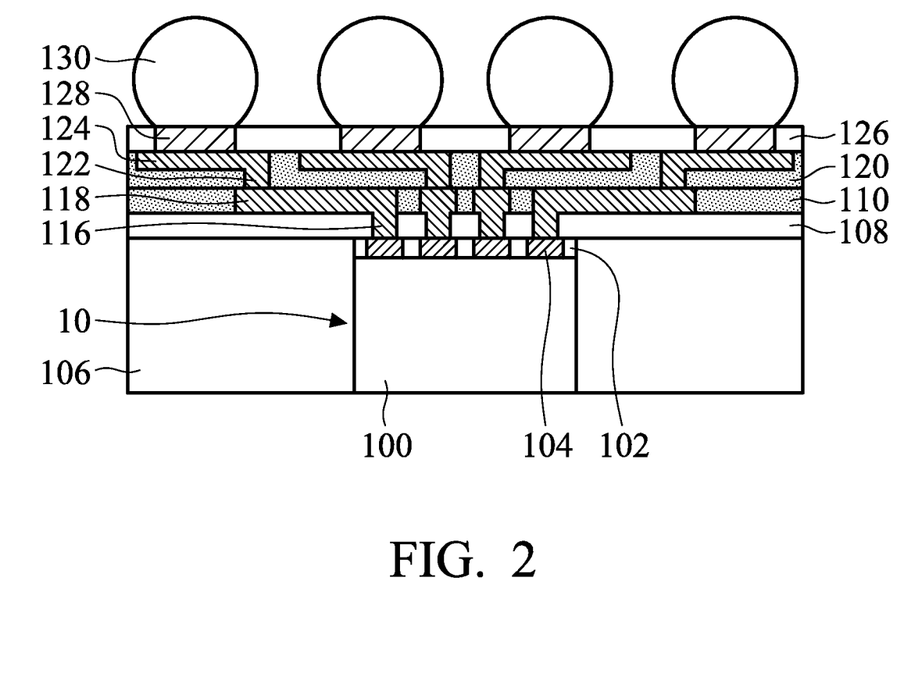
FIG. 2 is a cross-sectional view of a chip package, in accordance with some embodiments.

Many variations and/or modifications can be made to embodiments of the disclosure. In some embodiments, the chip package includes more than two semiconductor dies. In some embodiments, the chip package includes one semiconductor die. FIG. 2 is a cross-sectional view of a chip package, in accordance with some embodiments. As shown in FIG. 2, the chip package includes only one semiconductor die (the semiconductor die 10).

Embodiments of the disclosure provide a chip package including one or more semiconductor dies surrounded by a package layer such as a molding compound layer. An interconnection structure including dielectric layers made of a semiconductor oxide material is formed over the semiconductor dies and the package layer to provide a sub-micron fan-out interconnection to the semiconductor dies. A protection layer is formed on the semiconductor dies and the package layer to buffer stress before the formation of the interconnection structure. The protection layer may also cover defects or particles on the surface of the package layer and provide a planar surface to assist in the formation of the interconnection structure. Therefore, the reliability and quality of the chip package are significantly improved.

In accordance with some embodiments, a chip package is provided. The chip package includes a semiconductor die and a package layer partially or completely encapsulating the semiconductor die. The chip package also includes a polymer layer over the semiconductor die and the package layer. The chip package further includes a dielectric layer over the polymer layer. The dielectric layer is substantially made of a semiconductor oxide material. In addition, the chip package includes a conductive feature in the dielectric layer electrically connected to a conductive pad of the semiconductor die.

In accordance with some embodiments, a chip package is provided. The chip package includes a semiconductor die and a molding compound layer partially or completely encapsulating the semiconductor die. The chip package also includes a polymer layer over the semiconductor die and the molding compound layer. The chip package further includes a dielectric layer over the polymer layer, and the dielectric layer is harder than the polymer layer. In addition, the chip package includes a conductive feature in the dielectric layer electrically connected to a conductive pad of the semiconductor die.

In accordance with some embodiments, a method for forming a chip package is provided. The method includes forming a molding compound layer over a semiconductor die to partially or completely encapsulate the semiconductor die. The method also includes forming a polymer layer over the semiconductor die and the molding compound layer and forming a dielectric layer over the polymer layer. The dielectric layer is made of a semiconductor oxide material. The method further includes forming a conductive feature in the dielectric layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A chip package, comprising:
   a semiconductor die;
   a package layer at least partially encapsulating the semiconductor die;
   a polymer layer over the semiconductor die and the package layer;
   a dielectric layer over the polymer layer, wherein the dielectric layer is substantially made of a semiconductor oxide material; and
   a conductive feature in the dielectric layer, wherein the conductive feature is electrically connected to a conductive pad of the semiconductor die, wherein top surfaces of the dielectric layer and the conductive feature are coplanar.

2. The chip package as claimed in claim 1, wherein the polymer layer is in direct contact with the conductive feature.

3. The chip package as claimed in claim 1, wherein the polymer layer is in direct contact with the package layer.

4. The chip package as claimed in claim 1, wherein the dielectric layer is in direct contact with the polymer layer.

5. The chip package as claimed in claim 1, further comprising a second semiconductor die, wherein the package layer at least partially encapsulating the second semiconductor die.

6. The chip package as claimed in claim 5, wherein the second semiconductor die is electrically coupled to the semiconductor die through a second conductive feature in the dielectric layer.

7. The chip package of claim 1, wherein a first portion of the polymer layer on the package layer is thicker than a second portion of the polymer layer on the semiconductor die.

8. The chip package as claimed in claim 1, further comprising:
   a second dielectric layer over the dielectric layer and the conductive feature, wherein the second dielectric layer includes a semiconductor oxide material; and
   a second conductive feature in the second dielectric layer electrically connected to the conductive feature.

9. The chip package as claimed in claim 8, further comprising an etch stop layer between the dielectric layer and the second dielectric layer.

10. The chip package as claimed in claim 1, further comprising:
    a second polymer layer over the dielectric layer; and
    a conductive connector over the second polymer layer electrically connected to the conductive feature.

11. A chip package, comprising:
    a semiconductor die;
    a molding compound layer at least partially encapsulating the semiconductor die;
    a protection layer over the semiconductor die and the molding compound layer, wherein a first portion of the protection layer on the molding compound layer is thicker than a second portion of the protection layer on the semiconductor die;
    a dielectric layer over the protection layer, wherein the dielectric layer is harder than the protection layer; and
    a conductive feature in the dielectric layer, wherein the conductive feature is electrically connected to a conductive pad of the semiconductor die.

12. The chip package as claimed in claim 11, wherein the protection layer has a substantially planar top surface.

13. The chip package as claimed in claim 11, wherein the dielectric layer is not made of a polymer material.

14. The chip package as claimed in claim 11, wherein an interface between the protection layer and the molding compound layer is between an interface between the protection layer and the semiconductor die and a bottom of the semiconductor die.

15. A method for forming a chip package, comprising:
    forming a molding compound layer over a semiconductor die to at least partially encapsulate the semiconductor die;
    forming a polymer layer over the semiconductor die and the molding compound layer;
    forming a dielectric layer over the polymer layer, wherein the dielectric layer is made of a semiconductor oxide material;
    patterning the dielectric layer to have a first opening and patterning the polymer to have a second opening; and
    together filling the first opening and the second opening with a conductor to form a continuous conductive feature in the dielectric layer and the polymer layer.

16. The method of claim 15, wherein a first portion of the polymer layer on the molding compound layer.

17. The method for forming a chip package as claimed in claim 15, further comprising planarizing the polymer layer before the formation of the dielectric layer.

18. The method for forming a chip package as claimed in claim 15, wherein the dielectric layer is formed using a vapor deposition process.

19. The method for forming a chip package as claimed in claim 15, further comprising:
    planarizing the conductor to remove the conductor outside of the first opening such that a remaining portion of the conductor forms the conductive feature.

20. The method for forming a chip package as claimed in claim 15, wherein the feature opening comprises a via hole and a trench that are connected with each other.

* * * * *